United States Patent

Zhou

[11] Patent Number: 5,831,460
[45] Date of Patent: Nov. 3, 1998

[54] POWER-ON RESET CIRCUIT WITH SEPARATE POWER-UP AND BROWN-OUT TRIGGER LEVELS

[75] Inventor: Shi-dong Zhou, Milpitas, Calif.

[73] Assignee: Xilinx, Inc., San Jose, Calif.

[21] Appl. No.: 806,998

[22] Filed: Feb. 26, 1997

[51] Int. Cl.[6] .................................................. H03L 7/00
[52] U.S. Cl. ............................................. 327/143; 327/64
[58] Field of Search ................................. 327/63, 64, 65, 327/68, 69, 70, 142, 143

[56] References Cited

U.S. PATENT DOCUMENTS

| | | | |
|---|---|---|---|
| 5,534,804 | 7/1996 | Woo | 327/143 |
| 5,565,807 | 10/1996 | Ward | 327/143 |

*Primary Examiner*—Timothy P. Callahan
*Assistant Examiner*—Jeffrey Zweizig
*Attorney, Agent, or Firm*—Edel M. Young

[57] ABSTRACT

A power-on reset (POR) circuit including a first single-level POR, a second single-level POR, a combining circuit, and a latch. Responsive to the voltage on a voltage supply terminal, the first single-level POR generates a first reset signal which terminates at a first trigger level voltage, and the second single-level POR generates a second reset signal which terminates at a second trigger level voltage. A combining circuit logically combines the first and second reset signals, and generates a combined output signal. This output signal controls a latch which provides the POR signal. When the supply voltage is below both trigger levels a POR signal is generated. When the supply voltage is above both trigger levels, no POR signal is generated. When the supply voltage is between trigger levels of the two POR circuits, the combining circuit leaves a floating output signal. Thus the latch does not switch. Thus, the output of the POR circuit provides a reset pulse which, at power-up is triggered at the first (higher) single-level POR trigger level voltage, and during brown-out is triggered by the second (lower) single-level POR trigger level voltage.

6 Claims, 5 Drawing Sheets

| POR A | POR B | Combined Output Signal | POR Output Signal |
|---|---|---|---|
| 0 | 0 | 1 | 0 |
| 0 | 1 | (floating) | (prior state) |
| 1 | 0 | (floating) | (prior state) |
| 1 | 1 | 0 | 1 |

| POR A | POR B | Combined Output Signal | POR Output Signal |
|---|---|---|---|
| 0 | 0 | 1 | 0 |
| 0 | 1 | (floating) | (prior state) |
| 1 | 0 | 1 | 0 |
| 1 | 1 | 0 | 1 |

| POR A | POR B | Combined Output Signal | POR Output Signal |
|---|---|---|---|
| 0 | 0 | 1 | 0 |
| 0 | 1 | (floating) | (prior state) |
| 1 | 0 | (illegal state) | (prior state) |
| 1 | 1 | 0 | 1 |

POWER-ON RESET CIRCUIT WITH SEPARATE POWER-UP AND BROWN-OUT TRIGGER LEVELS

FIELD OF THE INVENTION

This invention relates generally to power-on reset circuits and, more particularly, to a power-on reset circuit with separate power-up and brown-out trigger levels.

BACKGROUND OF THE INVENTION

Storage elements (e.g. flip-flops, latches, registers, and memory devices) have two stable states, logical 0 and logical 1. The current state of such a storage element is not determined completely by the current state of its inputs, but rather depends on the history of the inputs. For example, when a register receives an enable signal, the state (logical 1 or 0) of a flip-flop within the register is set in accordance with the current state of a data input line associated with that flip-flop. The state of the flip-flop then remains unchanged, regardless of fluctuations on the data input line, until the register receives another enable signal. Thus, the state of the flip-flop at any given time depends on what the state of the data input line was when the register received the last read signal, and not on the current state of the data input line.

When systems containing storage elements are first powered-up, the storage elements typically come up in random states. The initial information stored in the storage elements is, therefore, useless or even harmful, and it is desirable to initialize the storage elements prior to operation of the system.

Known power-on reset ("POR") circuits generate a power-on reset pulse to initialize the storage elements. The POR signal is generated as the power supply voltage Vcc is rising from 0 volts to the operating voltage. FIG. 1 shows voltage versus time curves 102, 104 and 106 for power supply voltage Vcc and PORs A and B.

The first portion 110 of Vcc curve 102 shows the ramping of Vcc from 0 volts to the normal operating voltage that occurs during system power-up. The second portion 112 of Vcc curve 102 shows the maintenance of Vcc at the normal operating voltage. The third portion 114 of Vcc curve 102 shows the decline of Vcc from the normal operating voltage to 0 volts that occurs during system shut down.

POR A has a relatively high trigger voltage Va and POR B has a relatively low trigger voltage Vb. Curve 104 shows the output of POR A in response to the rise and fall of Vcc. Initially, the output of POR A rises with Vcc as shown by segment 120. Then, at time t1, Vcc is sufficiently high to enable POR A to generate a "low" reset signal by pulling its output to 0 volts. POR A continues to assert the low signal, as shown by segment 122, until Vcc reaches the trigger level voltage Va at time t2, at which time the output of POR A goes to Vcc, terminating the reset signal. The termination of the reset signal releases the initialized storage elements to function normally as long as Vcc remains above the trigger level voltage Va, as shown by section 124 of curve 104.

If during operation Vcc falls below a certain level, then the data stored in the storage elements is no longer reliable. In such a case, it is desirable to reinitialize the storage elements. Thus, the POR circuit should provide a brown-out reset pulse 126 if Vcc falls below a voltage level required to guarantee the reliability of the data stored in the sequential circuits. As shown by curve 104, when Vcc falls below Va at time t3, POR A generates the brown-out reset pulse 126. If Vcc continues to fall to 0 volts, as shown by section 114 of curve 102, then the output of POR A will of course fall to 0 volts, as shown by segment 128 of curve 104. If on the other hand, the dip of Vcc below Va is only momentary, then reset pulse 126 terminates when Vcc rises above Va and the storage elements again operate normally.

Although different PORs may have different trigger levels, as shown by curve 106 for POR B, in known POR circuits, the trigger levels for the power-on reset and the brown-out reset are the same. Therefore, selection of an appropriate trigger level voltage requires weighing competing interests. On the one hand, the trigger voltage must be high enough to ensure that Vcc has reached a level that ensures reliable operation of the storage elements and other circuit elements. On the other hand, the trigger level must not be set too close to the normal operating value of Vcc because minor fluctuations in Vcc may cause the system to be reset, thereby interrupting normal operation.

SUMMARY OF THE INVENTION

The present invention is a POR circuit with separate trigger levels. The circuit has a power-on reset trigger level close to the normal operating voltage of Vcc, thus ensuring that Vcc is high enough to ensure the proper operation of the system circuits before terminating the reset pulse. The circuit also has a lower brown-out reset trigger level, well below Vcc, to prevent unwanted resets in response to minor fluctuations in Vcc.

The POR circuit of the invention includes two single-level PORs having different trigger level voltages. One of the PORs is used to trigger the power-on reset function, and the other POR is used to trigger the brown-out reset function. Each single-level POR has an input terminal, coupled to a voltage supply terminal, and an output terminal. The PORs assert reset signals on their output terminals in response to the voltage on the supply terminal, terminating the reset signals when the supply voltage reaches each respective trigger level voltage. A combining circuit with two input terminals and an output terminal generates an output signal that is a function of both trigger voltage levels. The first input terminal is coupled to the output terminal of one of the single-level PORs, and the second input terminal is coupled to the output terminal of the remaining single-level POR. Responsive to the voltages asserted on the input terminals by the single-level PORs, the combining circuit asserts a combined output signal on its output terminal. A latch receives the combined output signal. If the combined output signal is floating, the latch does not change states. If the combined output signal is a logical 0 or logical 1, the combined output signal overrides the state of the latch, changing the state of the latch if necessary. An output signal from the latch is the POR output signal.

To achieve response to the two single-level POR circuits, the combined output signal floats when the Vcc level is between the trigger voltages of the two single-level POR circuits and pulls the latched value to 0 or 1 when Vcc is above or below both trigger voltages.

DETAILED DESCRIPTION

The present invention is described with reference to three exemplary embodiments. Specific details are set forth to provide a clear understanding of the invention, and not to limit the scope of the invention in any way. In other instances, well known circuit designs and techniques have been omitted so as not to obscure the present invention.

Figure 1:
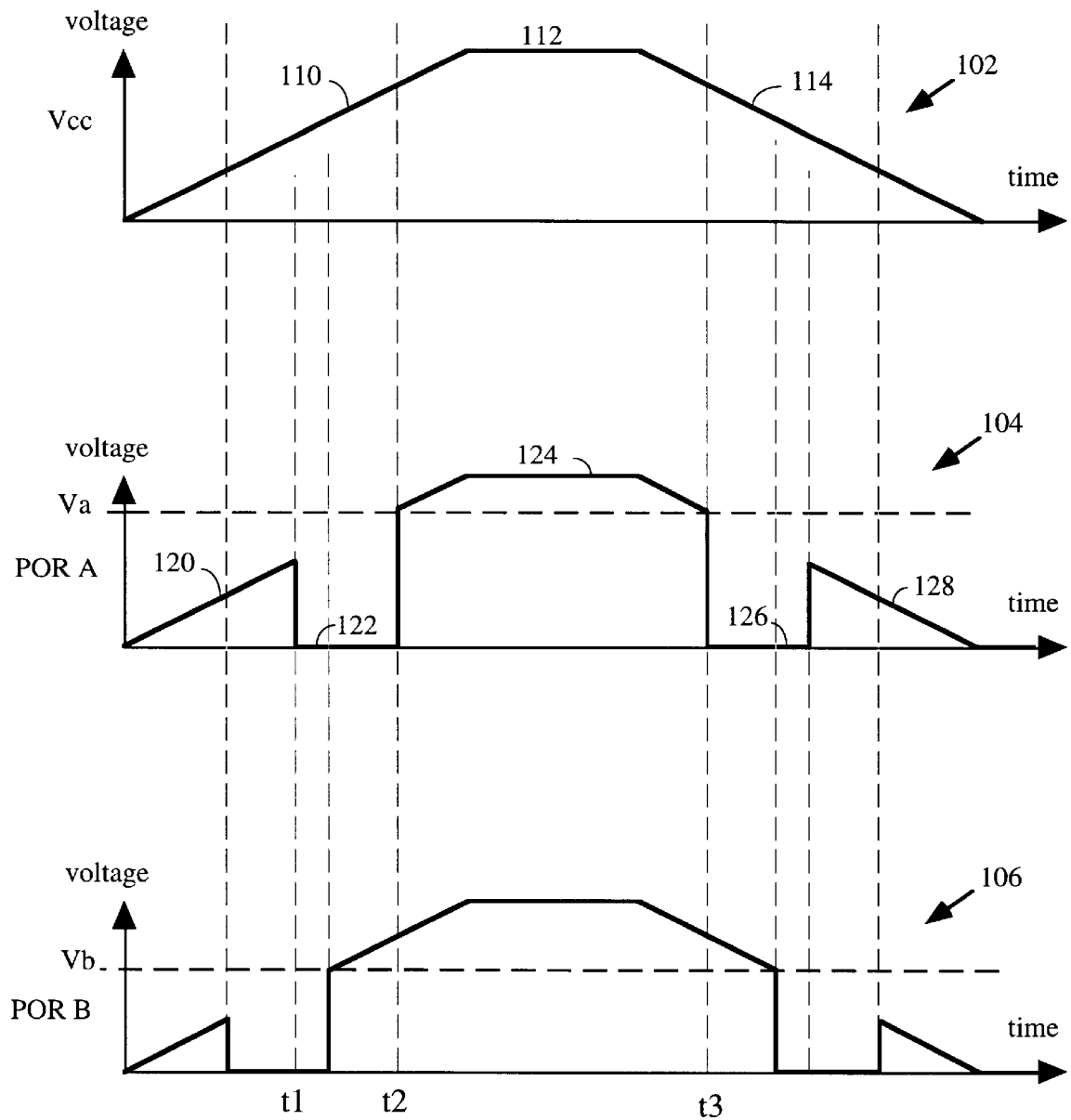
FIG. 1 shows voltage versus time curves for power supply voltage Vcc, a prior art power-on reset circuit POR A, and a prior art power-on reset circuit POR B.
Figures 2A, 3A:
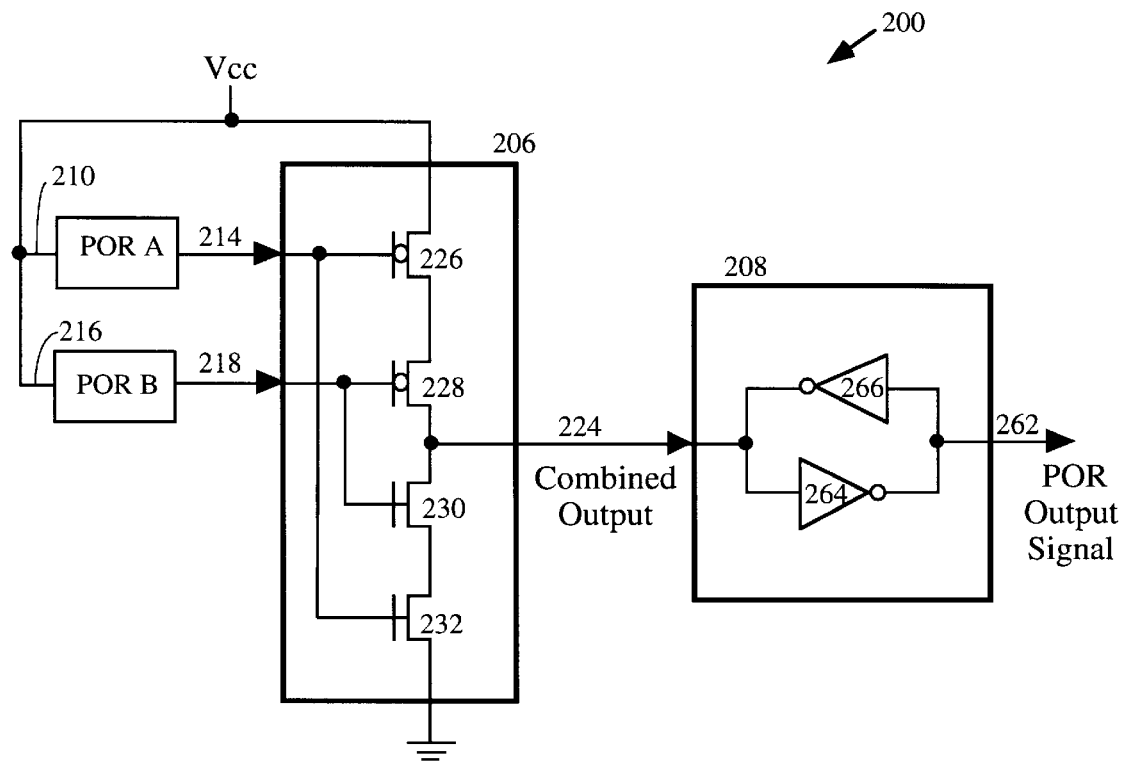
FIG. 2A is a circuit diagram of a first exemplary POR circuit.
FIG. 3A is a truth table for the POR circuit shown in FIG. 2A.

FIG. 2A is a circuit diagram of power-on reset (POR) circuit 200. POR circuit 200 includes high trigger point power-on reset circuit POR A, low trigger point power-on reset circuit POR B, combining circuit 206, and latch 208. Circuit POR A is a conventional POR circuit having an input terminal 210 coupled to a power supply voltage Vcc, and an output terminal 214. Similarly, circuit POR B is a conventional POR circuit having an input terminal 216 coupled to Vcc, and an output terminal 218. Circuit POR A and circuit POR B each assert a reset signal, responsive to Vcc, as shown in FIG. 1 and discussed above in conjunction with the background art.

Combining circuit 206 comprises four transistors, PMOS transistor 226, PMOS transistor 228, NMOS transistor 230 and NMOS transistor 232 coupled in series in that order between Vcc and ground. Gates of transistors 226 and 232 are controlled from output terminal 214 of circuit POR A, and gates of transistors 228 and 230 are controlled from output terminal 218 of circuit POR B. In another embodiment, POR B can control transistors 226 and 230 and POR A can control transistors 228 and 232. The important relationship is that each of POR A and POR B control one PMOS transistor and one NMOS transistor. Several embodiments can have this relationship. Responsive to the reset signals applied at terminals 214 and 218 respectively, combining circuit 206 asserts the combined output signal on output terminal 224.

Latch 208 comprises two inverters 264 and 266 connected into a loop. The POR output signal appears on latch output line 262. Inverter 266 provides the feedback signal to close the loop and must be overridden by a logic 0 or logic 1 on line 224. Thus transistors in inverter 266 are relatively weak. Inverter 264 must supply the POR output signal and thus may be relatively strong, or the signal on line 262 may be further buffered.

FIG. 3A is a truth table for POR circuit 200 shown in FIG. 2A. There are four possible input combinations to combining circuit 206. When Vcc is sufficiently high that both POR A and POR B output logical 1 (no reset needed), transistors 226 and 228 are both turned off, and the combined output signal is logical 0, which causes the POR output signal on line 262 to be logical 1 (not active and not resetting storage elements). When Vcc is below the high trigger point of POR A and above the lower trigger point of POR B, POR A outputs a logical 0 and POR B outputs a logical 1. Thus transistors 228 and 230 are both off, so no connection is provided from line 224 to either Vcc or ground. Thus, the combined output signal on line 224 is floating and the POR output signal on line 262 remains in its prior state. The situation in which POR A outputs a logical 1 and POR B outputs a logical 0 should occur only when Vcc is below about 2 volts in a 5 volt system since POR A has a higher trigger point than POR B. Thus this combination is not as important because below 2 volts structures in the system are not yet operating. However, if this should occur, the combined output signal would be floating, and the POR output signal would remain in its prior state. Finally, when Vcc is sufficiently low that POR A and POR B are both outputting logical 0 to indicate that a reset is needed, combined output signal line 224 carries logical 1 and the POR output signal on line 262 is logical 0, causing circuits to be reset (when Vcc is sufficient to operate the circuits at all).

Figures 2B, 3B:
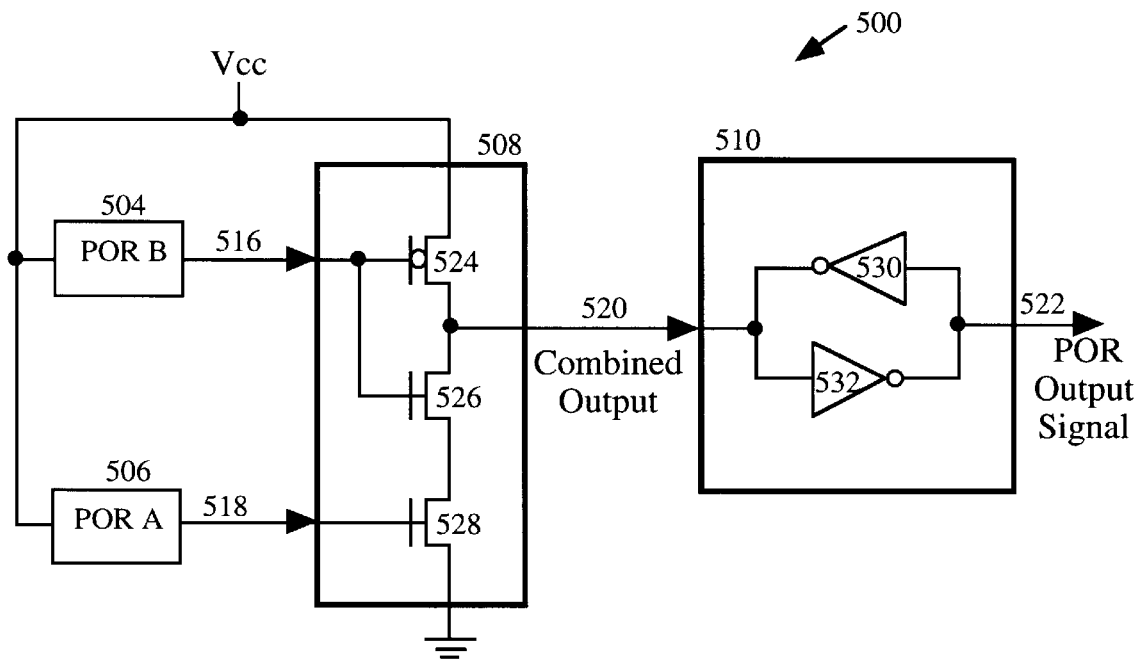
FIG. 2B is a circuit diagram of a second exemplary POR circuit.
FIG. 3B is a truth table for the POR circuit shown in FIG. 2B.

FIG. 2B shows a second embodiment of the invention. Circuit 500 includes low trigger point POR B 504, high trigger point POR A 506, combining circuit 508, and latch 510. Combining circuit 508 includes only one PMOS transistor 524 connected in series with NMOS transistors 526 and 528 between Vcc and ground.

FIG. 3B is a truth table for FIG. 2B. When Vcc is sufficiently low that POR A and POR B both output logical 0, transistor 524 is on, pulling combined output signal line 520 to logical 1, and keeping the POR output signal logical 0, thus not resetting circuits. When Vcc is between the trigger points of POR A and POR B, POR A outputs a logical 0 and POR B outputs a logical 1. Thus transistors 524 and 528 are both off, and the combined output signal on line 520 is floating, so POR output signal on line 522 remains in its prior state. If it should occur that POR A should output a logical 1 and POR B should output logical 0, transistor 524 would turn on, and the combined output signal would be logical 1, causing POR output signal on line 522 to be logical 0. However, because POR A has a higher trigger level than does POR B this combination should occur only when Vcc is very low: Finally when Vcc is sufficiently low that POR A and POR B both output logical 0, the combined output signal is pulled to logical 1 through transistors 526 and 528, and the POR output signal on line 522 is logical 0, causing a reset to occur.

Figures 2C, 3C:
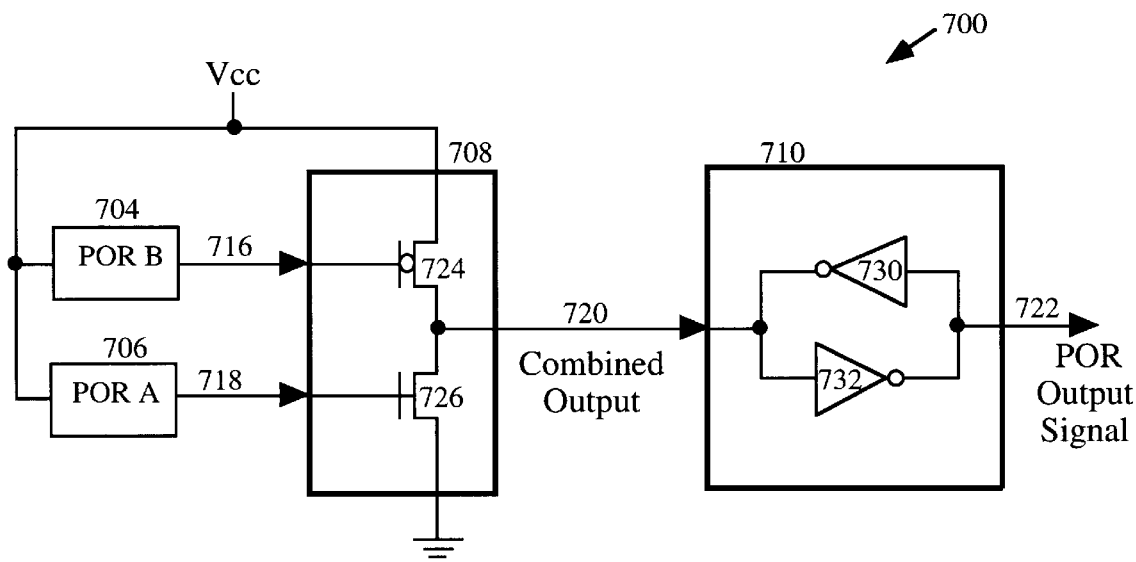
FIG. 2C is a circuit diagram of a third exemplary POR circuit.
FIG. 3C is a truth table for the POR circuit shown in FIG. 2C.

FIG. 2C shows a third embodiment of the invention. Combining circuit 708 includes only two transistors in series between Vcc and ground: PMOS transistor 724 connected to VCC and NMOS transistor 726 connected to ground.

FIG. 3C shows the truth table for FIG. 2C. When both POR A and POR B are high, transistor 726 turns on, pulling line 720 to logical 0 and causing the POR output signal to be logical 1, allowing circuits to operate normally. When both are low, transistor 724 turns on, pulling line 720 to Vcc, and causing the POR output signal 722 to be logical 0, thus resetting circuits. When POR A outputs a logical 0 and POR B outputs a logical 1, neither of transistors 724 and 726 turns on, so line 720 floats, and the POR output signal on line 722 remains in its previous state. It should not occur that POR B outputs logical 0 and POR A outputs logical 1, causing both of transistors 724 and 726 to turn on at the same time since POR A has the higher trigger level. This would produce a current path from Vcc to ground through the two transistors and could destroy the transistors as well as other circuit elements. However, when Vcc is about 2 volts in a 5 volt system, this undesirable (illegal) state occurs in a region where both POR A 706 and POR B 704 are barely operable. One way to ensure that the high current path does not occur is by selecting threshold voltages for transistors 724 and 726 such that the voltage levels output by either POR A 706 or POR B 704 will not turn on either transistor 724 or 726. With transistors 724 and 726 both off, then the POR output signal remains in its prior state.

Figure 4:
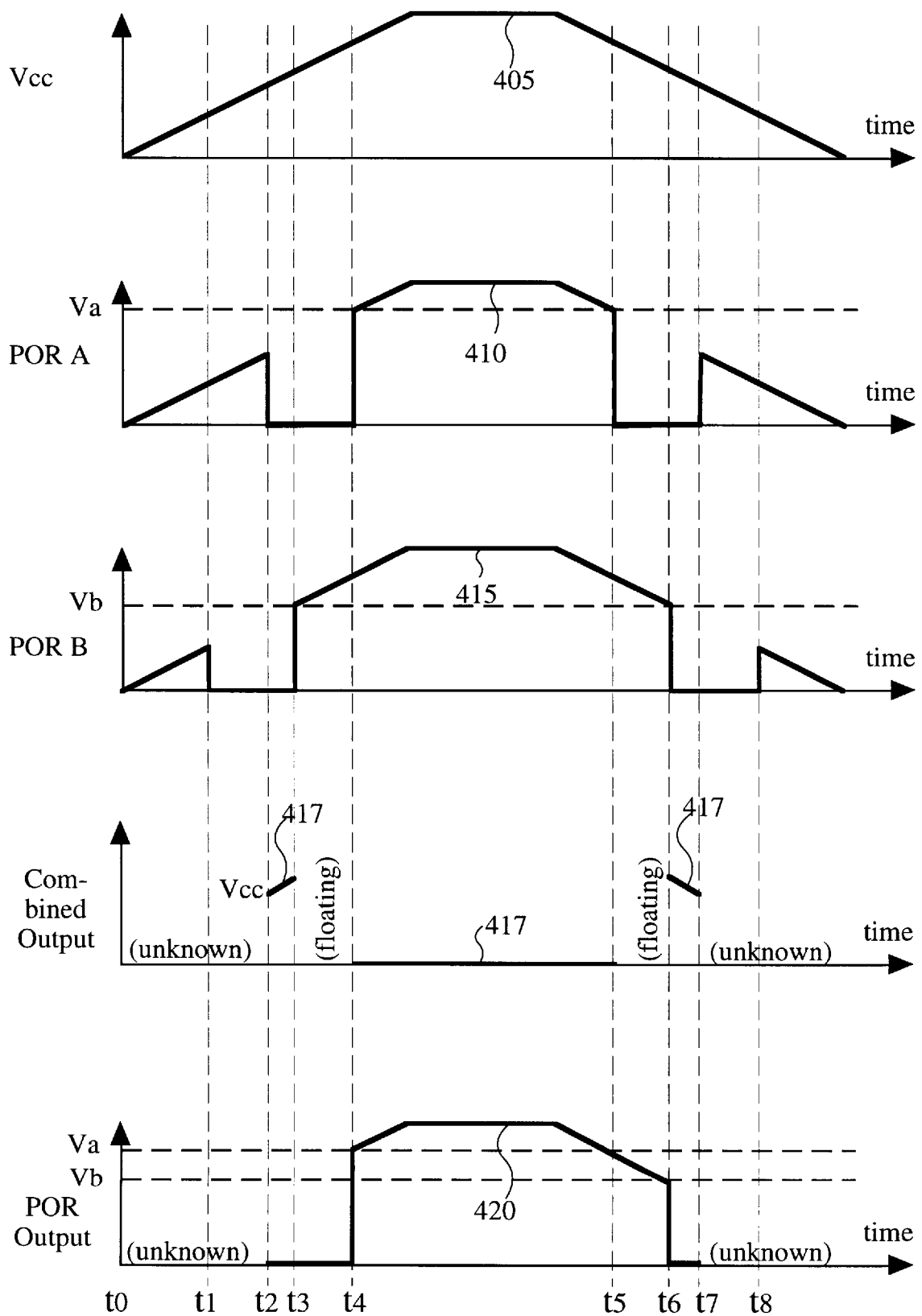
FIG. 4 shows voltage versus time curves for FIG. 2A, including Vcc, POR A, POR B, a combined output signal, and a POR output signal.

FIG. 4 shows voltage versus time curves 405, 410, 415, 417, and 420 of various portions of FIG. 2A. Vcc, POR A, POR B, the combined output signal, and the POR output signal are shown.

At time t0, power is turned on and Vcc begins to rise. POR A and POR B also begin to rise. Depending upon the threshold voltages for transistors 226, 228, 230, 232 in combining circuit 206, the combined output signal on output line 224 may either be at Vcc, ground, or floating and thus the signal on line 224 and also the POR output signal on line 262 are in unknown states.

At time t1, Vcc has risen sufficiently that POR B circuit outputs a logic 0 output signal. This turns on transistor 228 but still leaves the combined output signal and the POR output signal in unknown states. Any circuit driven by POR output signal line 262 is not yet in an operable state.

At time t2, POR A also begins to output a logical 0 output signal. This turns on transistor 226, which pulls line 224 to Vcc. Thus the combined output signal is shown to be at Vcc between time t2 and t3. This causes POR output signal on line 262 to go to logical 0.

At time t3, POR B again outputs a Vcc signal, which turns on transistor 230 but turns off transistor 228 and thus leaves combined output signal line 224 floating. Since POR output line 262 was at logical 0, it remains at logical 0.

At time t4, POR A begins to output a logical 1, which turns on transistor 232 and turns off transistor 226. Since transistor 230 and transistor 232 are both on, combined output signal line 224 is pulled to ground and POR output signal line 262 goes to Vcc.

At time t5, which may be the time of a momentary brown-out or the time of power-down, Vcc drops to Va, the trigger point for POR A. Thus, POR A outputs a logical 0 signal, turning off transistor 232 and leaving line 224 floating. If Vcc were to return to the full operating voltage at this point, no reset would occur, and the system would continue to operate normally.

If Vcc continues to fall, at time t6, POR B also outputs a reset signal and causes the combined output signal on line 224 to go to Vcc, which in turn causes the POR output signal on line 262 to go low, initiating a reset of all storage devices in the system. At times t7 and t8, Vcc continues to fall and the system ceases to operate.

POR circuit 500, shown in FIG. 2B generates a POR output curve that is identical to curve 420 in FIG. 4 between times t2 and t7 and so permits the present invention to operate properly.

POR circuit 700, shown in FIG. 2C also generates a POR output curve that is identical to curve 420 in FIG. 4 between times t2 and t7. However, between times t1 and t2 and times t7 and t8, POR circuit 700 theoretically sets the combined output signal at terminal 224 to an illegal state. In a solution discussed above, the thresholds for transistors 724 and 726 are chosen to be high enough that the low voltages output by POR A between times t1 and t2, and times t7 and t8 do not turn on both of transistors 724 and 726. As a result, this embodiment still permits the present invention to operate properly.

The preceding discussion describes three exemplary POR circuits 200, 500 and 700 that are capable of producing a power-on reset pulse which is responsive to a first trigger level voltage, and a brown-out reset pulse which is responsive to a second trigger level voltage. Specific details have been set forth to provide a clear understanding of the invention, but those skilled in the art will understand that the invention may be practiced apart from those details.

What is claimed is:

1. A power on reset circuit comprising:
    a latch for providing a reset signal, the latch having an input line for controlling a value stored in the latch and an output line for providing the reset signal;
    means for providing a deactivating signal on the input line to the latch for deactivating a reset pulse after a power supply voltage has risen above a higher trigger level voltage; and
    means for providing an activating signal on the input line to the latch for activating the reset pulse after the power supply voltage has fallen below a lower trigger level voltage.

2. The circuit of claim 1 wherein the input line provides no signal to the latch when neither the activating signal nor the deactivating signal are provided.

3. A power on reset circuit comprising:
    a combining circuit, having a combined output, and being coupled to receive a first voltage, a first reset signal, a second reset signal, and a second voltage,
    for connecting the first voltage to the combined output in response to inactive levels of the first and second reset signals,
    for connecting the second voltage to the combined output in response to active levels of the first and second reset signal voltages, and
    for disconnecting the first voltage and the second voltage from the combined output in response to an inactive level of the first reset signal and an active level of the second reset signal; and
    a latch, receiving the combined output, and being powered by the first and second voltages, the latch connecting the first voltage to its output terminal in response to a first value of the combined output and connecting the second voltage to its output terminal in response to a second value of the combined output and making no change in its output in response to a floating value of the combined output.

4. The circuit of claim 3 wherein the combining circuit comprises:
    a PMOS transistor coupled between said first voltage and an output terminal for providing the combined output, said PMOS transistor being controlled by a POR circuit having a low trigger voltage;
    an NMOS transistor coupled between said second voltage and said output terminal for providing the combined output, said NMOS transistor being controlled by a POR circuit having a high trigger voltage.

5. The circuit of claim 4 wherein the combining circuit further comprises:
    a second NMOS transistor coupled in series with said NMOS transistor between said second voltage and said output terminal, said second NMOS transistor being controlled by said POR circuit having a low trigger voltage.

6. The circuit of claim 3 wherein the combining circuit comprises:
    a first PMOS transistor and a second PMOS transistor connected in series between said first voltage and an output terminal for providing the combined output,
    a first NMOS transistor and a second NMOS transistor connected in series between said second voltage and said output terminal,
    one of said PMOS transistors and one of said NMOS transistors being controlled by a first POR circuit,
    the other of said PMOS transistors and the other of said NMOS transistors being controlled by a second POR circuit.

* * * * *